US007250373B2

(12) United States Patent
Mui et al.

(10) Patent No.: US 7,250,373 B2
(45) Date of Patent: Jul. 31, 2007

(54) METHOD AND APPARATUS FOR ETCHING MATERIAL LAYERS WITH HIGH UNIFORMITY OF A LATERAL ETCH RATE ACROSS A SUBSTRATE

(75) Inventors: David Mui, Fremont, CA (US); Wei Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 187 days.

(21) Appl. No.: 10/927,807

(22) Filed: Aug. 27, 2004

(65) Prior Publication Data

US 2006/0046496 A1 Mar. 2, 2006

(51) Int. Cl.
*H01L 21/302* (2006.01)

(52) U.S. Cl. .............. 438/714; 438/710; 438/711; 438/712

(58) Field of Classification Search ........ 438/710–712, 438/714
See application file for complete search history.

(56) References Cited

U.S. PATENT DOCUMENTS

| | | | |
|---|---|---|---|
| 5,556,501 A * | 9/1996 | Collins et al. ......... 156/345.38 | |
| 5,926,690 A | 7/1999 | Toprac et al. | |
| 5,948,203 A | 9/1999 | Wang | |
| 6,054,013 A * | 4/2000 | Collins et al. ......... 156/345.27 | |
| 6,161,054 A | 12/2000 | Rosenthal et al. | |
| 6,303,512 B1 * | 10/2001 | Laermer et al. ............ 438/712 |
| 6,368,975 B1 | 4/2002 | Balasubramhanya et al. |
| 6,388,253 B1 | 5/2002 | Su |
| 6,413,867 B1 | 7/2002 | Sarfaty et al. |
| 6,424,417 B1 | 7/2002 | Cohen et al. |
| 6,455,437 B1 | 9/2002 | Davidow et al. |
| 6,486,492 B1 | 11/2002 | Su |
| 6,790,779 B2 | 9/2004 | Schermerhorn et al. |
| 6,828,187 B1 | 12/2004 | Liu et al. |
| 6,829,056 B1 * | 12/2004 | Barnes et al. ............... 356/625 |
| 6,833,325 B2 | 12/2004 | Huang et al. |
| 2002/0171828 A1 | 11/2002 | Cohen et al. |
| 2003/0136766 A1 * | 7/2003 | Hoffman et al. ....... 219/121.43 |
| 2004/0224090 A1 * | 11/2004 | Krishnaraj et al. .... 427/255.28 |
| 2005/0208773 A1 * | 9/2005 | Huang et al. ............... 438/719 |

OTHER PUBLICATIONS

Lee, et al., "Analysis of Reflectometry and Ellipsometry Data from Patterned Structures," Characterization and Metrology for UCSI Technology: 1998 International Conference, Seiler, et al., eds., p. 331-335.

Toprac, A., "AMD's Advanced Process Control of Ply-Gate Critial Diminsion," Proc. SPIE vol. 3882, p. 62-65, Sep. 1999.

Yang, et al., "Line-profile and Critical Dimension Measurements Using a Normal Incidence Optical Metrology System," Proceedings of SPIE vol. 4689, Mar. 2002.

* cited by examiner

*Primary Examiner*—Zandra V. Smith
*Assistant Examiner*—Bac H. Au
(74) *Attorney, Agent, or Firm*—Patterson & Sheridan, LLP

(57) ABSTRACT

A method and apparatus for etching material layers with high uniformity of a lateral etch rate across a substrate using a gas mixture that includes a passivation gas. The passivation gas is provided to a peripheral region of the substrate to passivate sidewalls of the structures being etched.

4 Claims, 4 Drawing Sheets

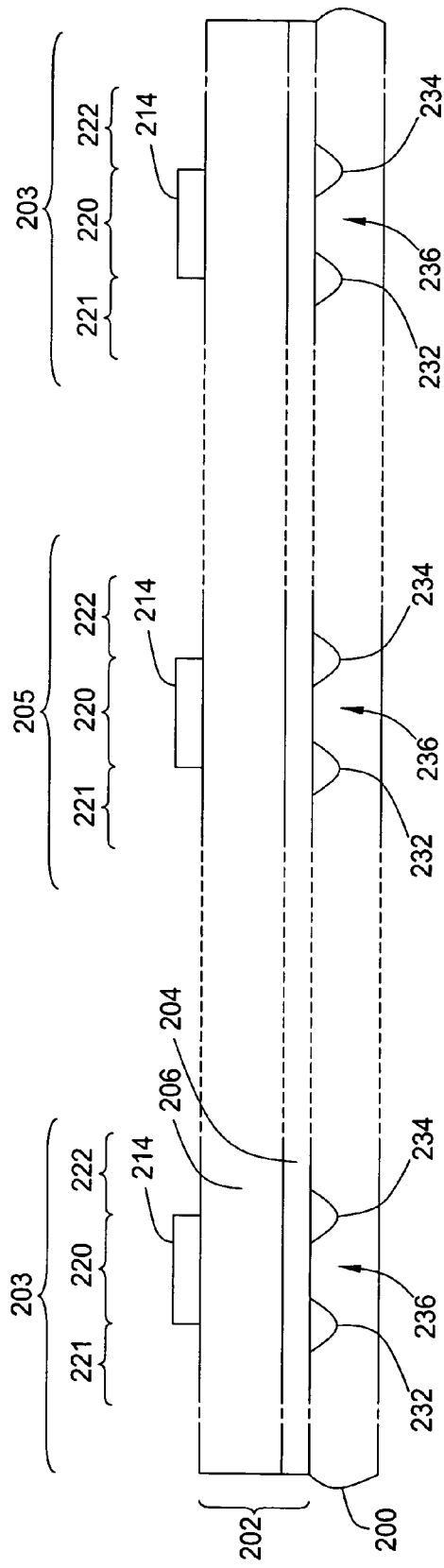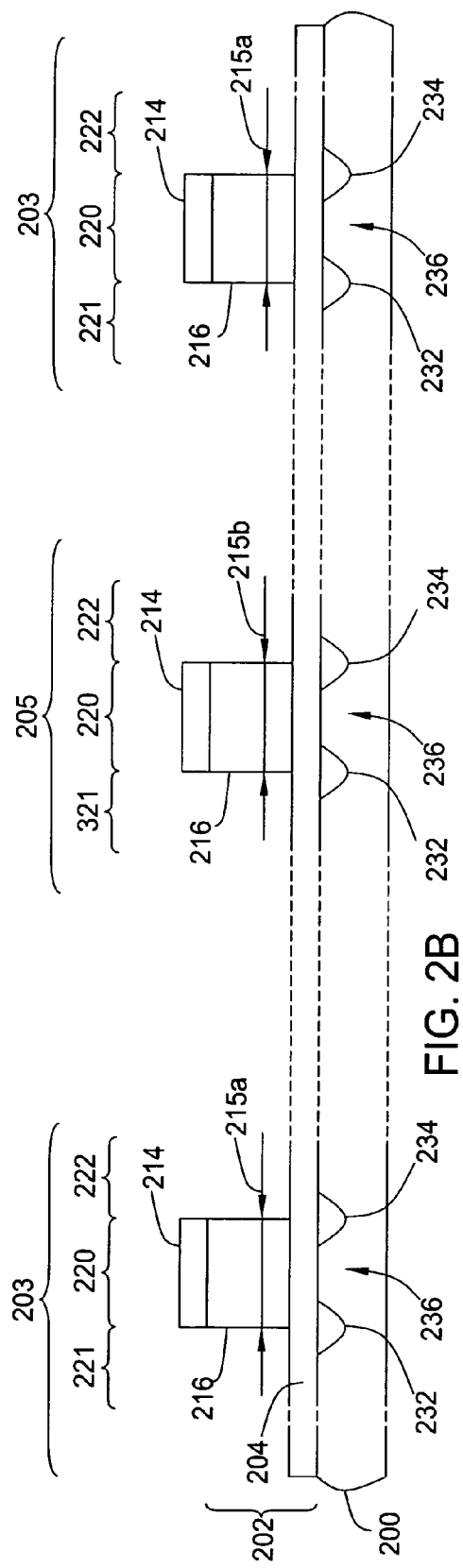
FIG. 2A
FIG. 2B

METHOD AND APPARATUS FOR ETCHING MATERIAL LAYERS WITH HIGH UNIFORMITY OF A LATERAL ETCH RATE ACROSS A SUBSTRATE

BACKGROUND OF THE INVENTION

1. Field of the Invention

The present invention generally relates to a method and apparatus for fabricating devices on semiconductor substrates. More specifically, the present invention relates to a method and apparatus for performing an etch process in a semiconductor substrate processing system.

2. Description of the Related Art

Ultra-large-scale integrated (ULSI) circuits may include more than one million micro-electronic devices (e.g., transistors, capacitors, and the like) that are formed on a substrate (e.g., silicon (Si) wafer) and cooperate to perform various functions within the device. Manufacture of ULSI circuits generally comprises processes where one or more material layers of a film stack on the substrate are etched (e.g., plasma etched) to form structures of the devices being fabricated.

One problem associated with a conventional etch process is the non-uniformity of a lateral etch rate across the substrate due to a substrate edge effect. Herein lateral etch rate non-uniformity is defined as a ratio of a difference between the maximal and minimal lateral etch rate to the sum of such values across the substrate. More specifically, the lateral etch rate at peripheral locations (i.e., near an edge of the substrate) is higher than the lateral etch rate near a center of the substrate. Non-uniformity in the lateral etch rate results in non-uniformity in the critical dimensions of the structures formed by the etch process.

During the etch process, non-volatile by-products passivate sidewalls of the structures being formed and, as such, reduce the etch rate. Non-uniformity of the etch rate across the substrate is caused by a higher concentration of the by-products near the center of the substrate than in the peripheral region. In operation, a concentric pattern of exhaust pumping in the etch process chamber results in a low concentration of the by-products near the edge of the substrate and, correspondingly, in a high local lateral etch rate.

Structures being formed using the conventional etch process are typically over-etched in the peripheral region that may extend about 10-20 mm from the edge of the substrate. Such a region represents approximately 19-36% and 13-25% of usable real estate for the 200 mm and 300 mm substrate, respectively. A loss of accuracy for topographic dimensions (e.g., critical dimensions (CDs), or smallest widths) of the etched structures in the peripheral regions of the substrates may significantly affect performance and increase costs of fabricating the integrated circuits and micro-electronic devices.

Therefore, there is a need in the art for an improved method for etching material layers with high uniformity of a lateral etch rate across a substrate in manufacture of micro-electronic devices.

SUMMARY OF THE INVENTION

The present invention is a method and apparatus for etching material layers with high uniformity of a lateral etch rate across a substrate using a gas mixture that includes a passivation gas. The passivation gas is provided to a peripheral region of the substrate to passivate sidewalls of the structures being etched. In one embodiment, the lateral etch rate in the peripheral region of the substrate may be selectively adjusted by controlling a flow rate and a degree of dissociation of the passivation gas in the peripheral region.

BRIEF DESCRIPTION OF THE DRAWINGS

The teachings of the present invention can be readily understood by considering the following detailed description in conjunction with the accompanying drawings, in which:

FIGS. 2A-2B depict a series of schematic, cross-sectional views of a substrate having a gate structure of a field effect transistor being formed in accordance with the method of FIG. 1;

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method and apparatus for etching topographic structures in material layers on a substrate (e.g., semiconductor wafer, and the like) with high uniformity of lateral etch rate across the substrate. The method is generally used during fabrication of ultra-large-scale integrated (ULSI) semiconductor devices and circuits.

Figure 1:
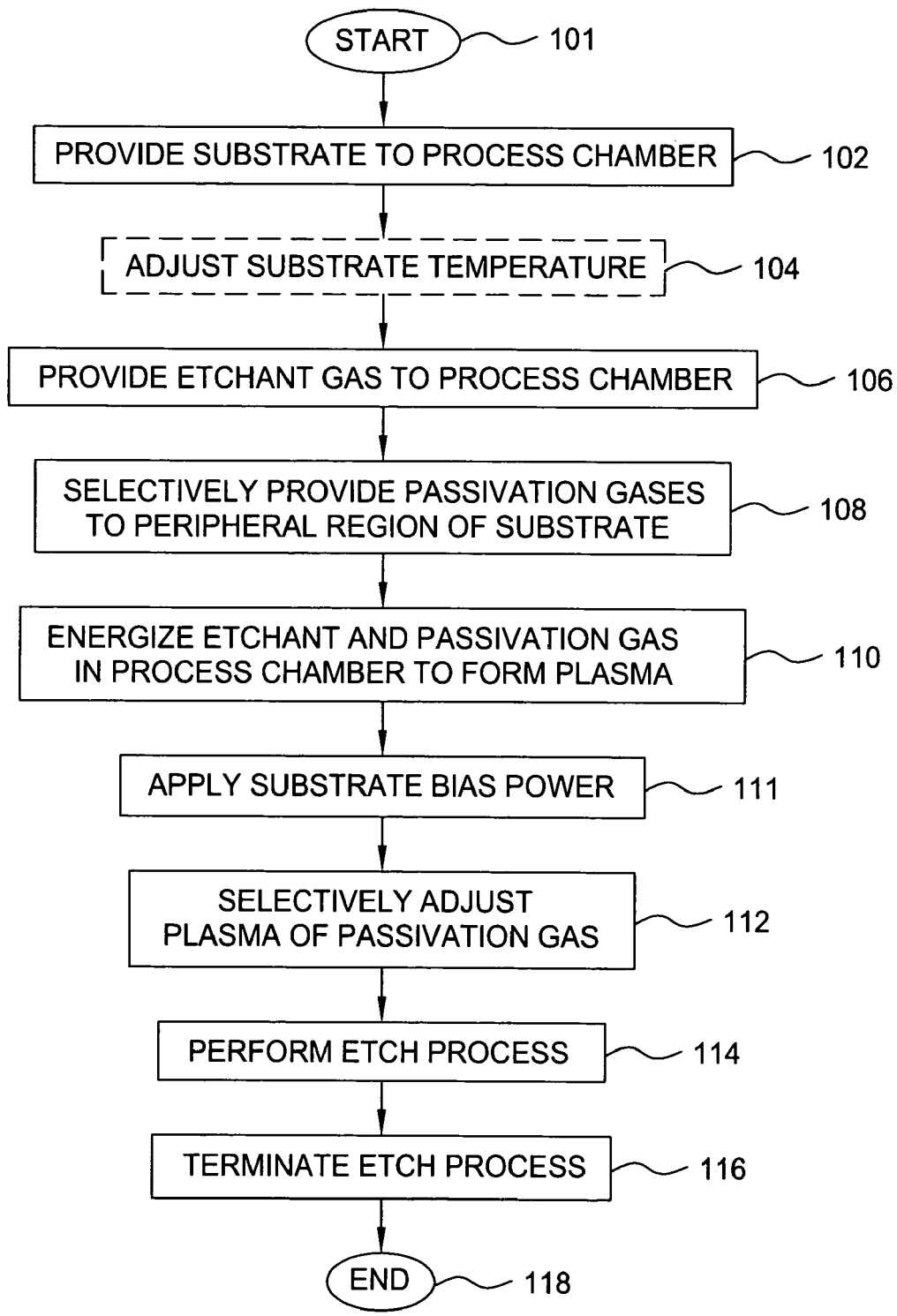
FIG. 1 depicts a flow diagram of a method for etching features in material layers with high uniformity of lateral etch rate across the substrate in accordance with one embodiment of the present invention.

FIG. 1 depicts a flow diagram of one embodiment of the inventive method for etching topographic structures in material layers on a substrate with high uniformity of lateral etch rate across the substrate as method 100. The method 100 includes the processes that are performed upon a film stack formed on the substrate.

The method 100 starts at step 101 and proceeds to step 102. At step 102, a substrate having a patterned etch mask is provided to an etch reactor (e.g., exemplary DPS II module discussed below with reference to FIG. 4) and is positioned on a substrate pedestal in a process chamber of the reactor. The patterned etch mask (e.g., photoresist or hard mask) is generally formed upon an underlying film stack that comprises at least one material layer.

At an optional step 104, the temperature of the substrate pedestal may be adjusted in accordance with a process recipe for the etch process to be performed upon the substrate (discussed in reference to step 114 below). Generally, temperature of the substrate pedestal is maintained constant during processing a plurality of substrates (substrate batch). The temperature of the substrate may be increased or decreased and then is maintained at a pre-determined level using a backside gas, as described below with reference to FIG. 4. Certain etch processes are performed upon substrates having ambient temperature.

At step 106, an etchant gas is supplied to the process chamber of the etch reactor. Generally, the etchant gas is a mixture of individual gases that are suitable for etching the material layer(s) beneath the patterned etch mask. Generally, the etchant gas is dispersed into the process chamber through one or more gas inlets (e.g., openings, injectors, and the like) that are disposed substantially above the substrate.

At step 108, a passivation gas is supplied to the process chamber. The passivation gas is dispersed into the process chamber through a plurality of gas inlets (e.g., openings, injectors, and the like) that are disposed substantially equidistantly around a peripheral region of the substrate. The gas inlets are adapted to provide the passivation gas predominantly to the peripheral region of the substrate. A flow rate of the passivation gas may be selectively controlled to facilitate a high concentration of such gas in the peripheral region. Specifically, the concentration of the passivation gas in the peripheral region may be adjusted to be higher than the concentration of such a gas in a central region of the substrate.

At step 110, a gas mixture of the etchant and passivation gases is energized to form a plasma in the process chamber. In one embodiment, the plasma is produced using an inductive antenna comprising at least two selectively controlled concentric antenna elements that are disposed above a dielectric ceiling of the process chamber. Alternatively, in a reactive ion etch reactor (RIE) reactor, the gas mixture may be energized to form the plasma using at least one capacitive electrode disposed in a process chamber of the reactor. Similarly, in an electron cyclotron resonance (ECR) reactor, such a plasma may be produced using a source of microwave power. In yet alternate embodiment, the gas mixture in the process chamber is not energized to form a plasma. For such an embodiment, step 110 is considered optional.

At step 111, a substrate bias power may be applied. However, for certain etch processes substrate biasing is not necessary. As such, step 111 is considered optional.

In alternate embodiments, steps 104 and 106, or steps 106 and 108, or steps 104, 106, and 108 may be performed in the same process chamber. In a further embodiment, step 110 may be performed before step 108, and similarly step 112 may precede step 111.

At step 112, density of a plasma of the passivation gas in the peripheral region may be selectively adjusted to control a degree of dissociation and chemical activity (e.g., a rate of passivating sidewalls of the structures being formed on the substrate) of the passivation gas in that region. In one exemplary embodiment, the density of the plasma is adjusted by controlling an amount of RF power provided to an outer coil element 412a (discussed below with respect to FIG. 4) of the inductive antenna 412. More specifically, the density of the plasma and, as such, degree of dissociation of the passivation gas in the peripheral region of the substrate increase when more RF power is provided to the outer coil element 412a. In other types of plasma reactors, other techniques may be used for plasma control.

At step 114, an etch process is performed to etch a material layer formed on the substrate. During the etch process, a portion of the etchant gas and by-products from the etch process are pumped away. A remaining portion of the by-products are re-deposited on sidewalls of the structures being formed on the substrate, thus reducing the lateral etch rate. Due to a concentric pattern of gas exhaust in the etch chamber, the concentration of such by-products may be depleted in the peripheral region faster than in the center region of the substrate. A low concentration of the by-products in the peripheral region causes an increase in the etch rate in that region.

During the etch process, the passivation gas forms a passivation film on sidewalls of the structures being formed in a peripheral region of the substrate. The chemistry of the passivation gas is selected such that the passivation film deposited on the sidewalls of the structures is chemically similar to the by-products of the etch process. The flow rate and degree of dissociation (i.e., plasma density) of the passivation gas may be selectively adjusted to compensate for depletion of the by-products of the etch process and to reduce the lateral etch rate in the peripheral region of the substrate. Specifically, the flow rate and plasma density of the passivation gas may be selectively adjusted such that lateral etch rates in the central and peripheral regions of the substrate are the same or approximately the same. As such, using controlled high concentration and controlled plasma density of the passivation gas in the peripheral region of the substrate, structures (e.g., structures having smallest width, or critical dimensions (CDs)) may be etched with high uniformity of the lateral etch rate across the substrate.

Settings for selectively adjusting the flow rate of the passivation gas and plasma density or a degree of dissociation of the passivation gas that provide a uniform lateral etch rate across the substrate may be defined based on the results of etching one or more test substrates. During subsequent etching of the product substrates, such settings are used at step 108 (flow rate of the passivation gas) and step 112 (RF power to the outer coil element 412a).

At step 116, the etch process is terminated. Typically, the endpoint of the etch process is determined by an endpoint detection system that may use monitoring of plasma emissions at a particular wavelength, laser interferometery, control of process time, and the like. Generally, step 116 terminates the plasma, substrate bias, and supplying of etchant, passivant, and backside gases, as well as prepares the substrate for removal from the process chamber 410 of the etch reactor 400. Alternatively, the substrate may stay in the process chamber for optional additional in-situ processing.

At step 118, the method 100 ends.

In one illustrative application of the present invention, a gate electrode layer of a gate structure of a field effect transistor (e.g., complementary metal-oxide-semiconductor (CMOS) field effect transistor, and the like) is etched using the method 100.

FIGS. 2A-2B depict a series of schematic, cross-sectional views of a substrate having a film stack of a gate structure of the field effect transistor being fabricated. In this specific embodiment, critical topographic dimensions for a gate electrode of the gate structure are controlled using processing steps of the method 100. Such steps are illustratively performed using a DPS II module (described below with reference to FIG. 4) of a CENTURA® processing system available from Applied Materials, Inc. of Santa Clara, Calif. The cross-sectional views in FIGS. 2A-2B are not depicted to scale and are simplified for illustrative purposes. To best understand the invention, the reader should simultaneously refer to FIG. 1 and FIGS. 2A-2B.

At step 102, a substrate 200 (e.g., silicon (Si) wafer, and the like) is transported to an etch reactor and is placed on the substrate pedestal within the reactor.

Referring to FIG. 2A, the substrate 200 generally comprises a plurality of doped source regions (wells) 232 and drain regions (wells) 234 (i.e., regions that will subsequently be doped to form sources and drains after the gate is formed)

separated by channel regions 236, a film stack 202 of a gate structure of the transistor being fabricated, and a patterned mask 214. In one embodiment, the film stack 202 comprises a gate dielectric layer 204 and a gate electrode layer 206. The patterned mask 214 protects region 220 above the channel region 236 as well as portions of the regions 232 and 234 and exposes adjacent regions 221 and 222 of the substrate 200 to the etched gases.

During etching of the layers of the film stack 202, the patterned mask 214 is used as an etch mask. The patterned mask 214 may comprise, for example, photoresist, silicon dioxide ($SiO_2$), silicon oxynitride (SiON), silicon nitride ($Si_3N_4$), hafnium dioxide ($HfO_2$), Advanced Patterning Film™ (APF) available from Applied Materials, Inc. of Santa Clara, Calif., and the like. The APF generally comprises films of SiON and α-carbon. Processes of forming such patterned masks are well known in the art. In one exemplary embodiment, the patterned mask 214 is formed of silicon oxynitride.

In one exemplary embodiment, the gate electrode layer 206 is formed of doped polysilicon (Si) and the gate dielectric layer 204 is formed of silicon dioxide ($SiO_2$). Alternatively, the gate dielectric layer 204 may comprise a high-K dielectric material having a dielectric constant greater than 4.0, such as hafnium dioxide ($HfO_2$), hafnium silicon dioxide ($HfSiO_2$), and the like. Generally, the layers 206 and 204 are formed to a thickness of about 500 to 6000 Angstroms and 10 to 60 Angstroms, respectively. The film stack 202 may also comprise layers formed of other materials having different thicknesses.

The layers of the film stack 202 may be formed using any conventional deposition technique, such as atomic layer deposition (ALD), physical vapor deposition (PVD), chemical vapor deposition (CVD), plasma enhanced CVD (PECVD), and the like. Fabrication of the field effect transistor may be performed using the respective process modules of CENTURA®, ENDURA®, and other semiconductor wafer processing systems available from Applied Materials, Inc. of Santa Clara, Calif.

At step 104, the temperature of the substrate 200 is increased to and then maintained between about 20 and 80 degrees Celsius using a heater and helium (He) as a heat transfer (i.e., backside) gas. In one exemplary embodiment, the substrate 200 is maintained at about 45 degrees Celsius.

At step 106, the etchant gas for etching polysilicon comprising a gas mixture including one or more halogen-containing gases, such as chlorine ($Cl_2$), hydrogen bromide (HBr), carbon tetrafluoride ($CF_4$), and the like, begins flowing into the process chamber. The etchant gas may optionally include a diluent gas, such as at least one of nitrogen ($N_2$), argon (Ar), helium (He), neon (Ne), and the like. In one embodiment, step 106 provides hydrogen bromide (HBr) at a flow rate of 20 to 300 sccm, chlorine ($Cl_2$) at a flow rate of 20 to 300 sccm (i.e., a HBr:$Cl_2$ flow ratio ranging from 1:15 to 15:1), and nitrogen ($N_2$) at a flow rate of 0 to 200 sccm, and a pressure in the process chamber between 2 and 100 mTorr. One exemplary process provides HBr at a flow rate of 40 sccm, $Cl_2$ at a flow rate of 40 sccm (i.e., a HBr:$Cl_2$ flow ratio of about 1:1), $N_2$ at a flow rate of 20 sccm, and a chamber pressure of about 45 mtorr.

At step 108, the passivation gas comprising a gas mixture including one or more of fluorosilane ($SiF_4$), silane ($SiH_4$), silicon tetrachloride ($SiCl_4$) and an optional diluent inert gas (e.g., argon (Ar), helium (He), and the like) begins flowing into the process chamber. During etching of the polysilicon gate electrodes (discussed in reference to step 114 below), the passivation gas forms $SiO_2$-like deposits on sidewalls of the gate electrodes. Such deposits are chemically similar to the by-products of the etch process. The concentration of the passivation gas in a peripheral region 203 of the substrate 200 is adjusted to be higher than the concentration of the gas in a central region 205 of the substrate. In one embodiment, step 108 provides fluorosilane ($SiF_4$) at a flow rate of 1 to 100 sccm or silane ($SiH_4$) at a flow rate of 1 to 100 and helium (He) at a flow rate of 1 to 200 sccm. One exemplary process provides $SF_4$ at a flow rate of 20 sccm or $SiH_4$ at a flow rate of 20 sccm and He at a flow rate of 200 sccm.

At step 110, a gas mixture comprising the etchant gas and the passivant gas is energized to a plasma using the inductive antenna (or other energy applications). In one embodiment, step 110 applies to the antenna between 200 and 3000 W of a source power, while one exemplary process applies about 1100 W.

At step 111, a substrate bias (i.e., cathode) power is applied to the substrate pedestal 416. In one embodiment, step 111 applies to the substrate pedestal between 0 and 300 W of the bias power, while one exemplary process applies about 20 W.

At step 112, plasma density of the passivation gas may be selectively adjusted by applying a higher power or current to the outer coil element 412a (discussed in reference to FIG. 4 below). In one exemplary embodiment, a ratio between currents in the outer coil element 412a and the inner coil element 412b is selectively adjusted in a range from about 0.3:1 to 10:1. In a more specific embodiment, the current ratio is between 0.3:1 and 5:1 and the total power is between 300 and 1500 watts.

Referring to FIG. 2B, at step 114, the gate electrode layer 206 (e.g., polysilicon) is etched and removed in the regions 221 and 222 using a gas mixture comprising the etchant gas and the passivation gas. A remaining portion of the gate electrode layer 206 forms gate electrodes 216 having widths 215a in the peripheral region 203 and widths 215b in the central region 205 of the substrate, respectively.

During the etch process, by-products of the etch process and the passivation gas form passivating films on sidewalls of the gate electrodes 216. The concentration of these by-products is high in the central region 205 and low in the peripheral region 203 of the substrate 200. Oppositely, the concentration of the passivation gas is high in the peripheral region 203 and low in the central region 205 of the substrate.

High concentrations of the passivation gas in the peripheral region 203 compensates for depletion of the by-products of the etch process near the edge of the substrate 200 and, as such, selectively reduce the lateral etch rate for the polysilicon gate electrode layer 206 in the peripheral region 203 of the substrate. After the etch process, the gate electrodes 216 have high uniformity of critical topographic dimensions (i.e., widths 215) across the substrate 200. Specifically, widths 215a and 215b of the gate electrodes 216 across the substrate are the same or about the same (i.e., widths of the gate electrodes 216 are uniform across the substrate 200).

At step 116, the etch process is terminated. In one embodiment, the endpoint of the etch process is determined using an endpoint detection system that is configured to monitor plasma emissions at a particular wavelength. At the endpoint of the etch process, the plasma, substrate bias, etchant gas, passivation gas and backside gases are terminated. Further, the substrate 200 is removed from the reactor. In an alternate embodiment, the substrate 200 may remain in the process chamber for optional additional in-situ processing (e.g., etching the gate dielectric layer 204, removal of the patterned mask 214, and the like).

At step 118, the method 100 ends.

Figure 3:
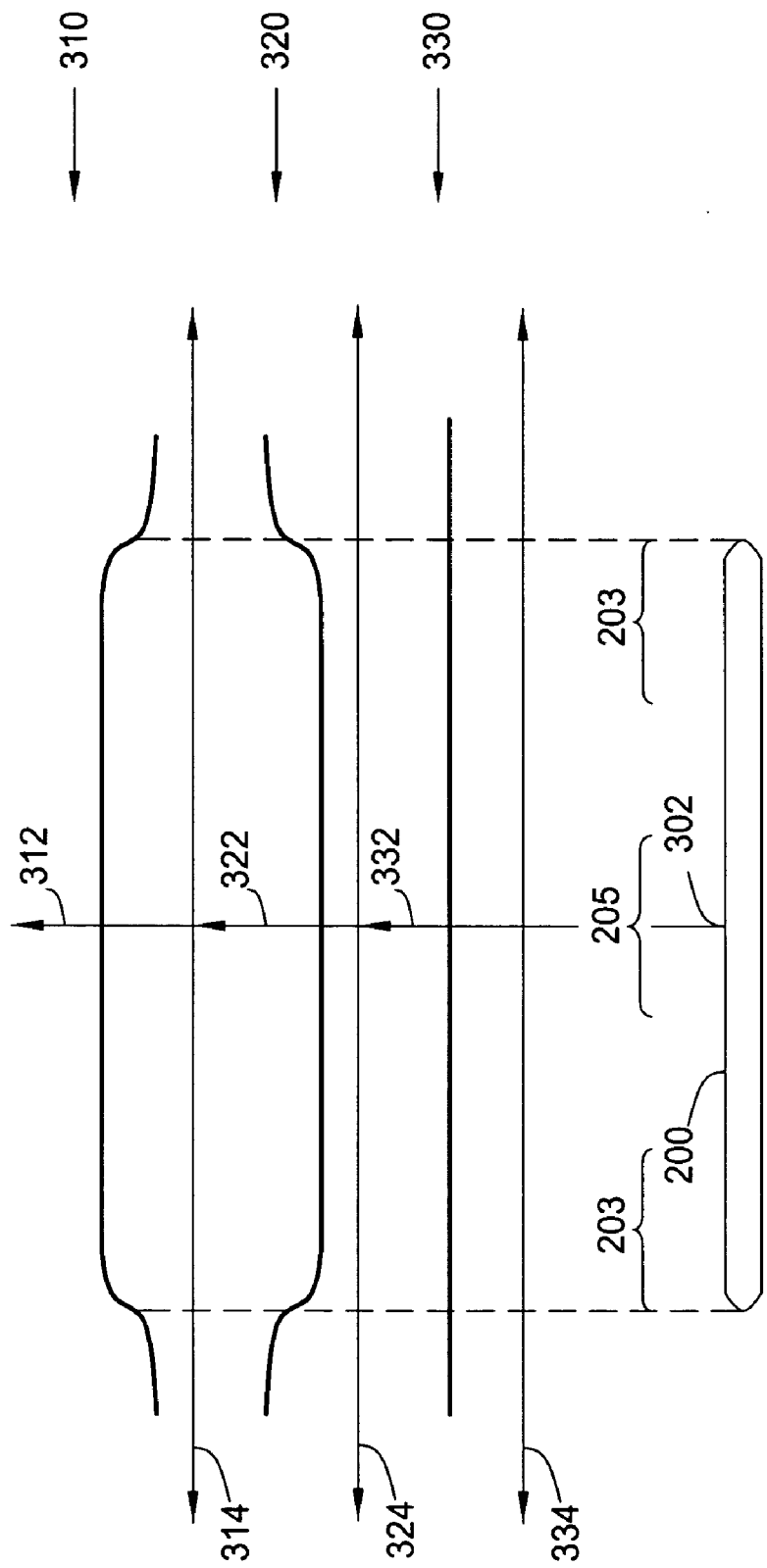
FIG. 3 depicts a graph of the concentration of by-products across a substrate being etched in accordance with the method of FIG. 1.

FIG. 3 depicts a series of exemplary diagrams illustrating concentrations of by-products of the etch process and the passivation gas across the surface of the substrate 200 in accordance with one embodiment of the method of FIG. 1. A schematic cross-sectional view of the substrate 200 is provided as a reference for the gas concentrations. A first graph 310 depicts a concentration (y-axis 312) of the by-products of the etch process versus a distance (x-axis 314) from a center 302 of the substrate 200. The concentration of by-products is less at the peripheral regions 203 of the substrate 200 as compared to the center region 205. A second graph 320 depicts a concentration (y-axis 322) of the passivation gas process versus a distance (x-axis 324) from the center 302. The concentration of passivation gas is higher at the peripheral regions 203 than in the center region 205. A third graph 330 depicts a resulting combined concentration (y-axis 332) of the by-products and the passivation gas (i.e., concentration of species that may reduce the etch rate) versus a distance (x-axis 334) from the center 302. The combined concentrations of by-products and passivation gas is uniform across the substrate 200. As such, the lateral etch rate is substantially uniform across the substrate.

Figure 4:
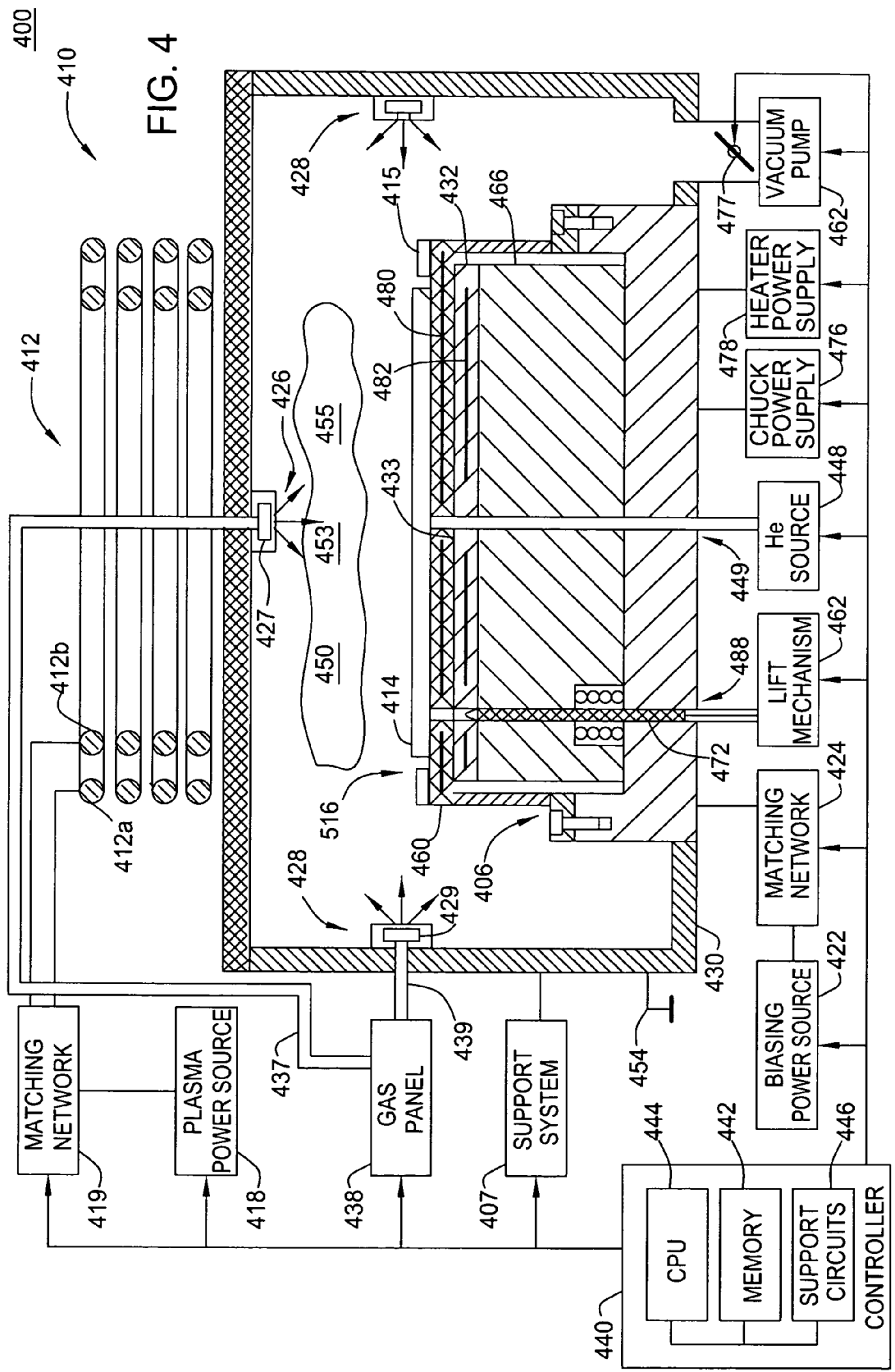
FIG. 4 depicts a schematic diagram of an exemplary etch processing apparatus of the kind used in performing portions of the inventive method.

FIG. 4 depicts a schematic diagram of an exemplary Decoupled Plasma Source (DPS) II etch reactor 400 that may illustratively be used to practice the invention. The DPS II reactor 400 is a processing module of a CENTURA® integrated semiconductor wafer processing system available from Applied Materials, Inc. of Santa Clara, Calif. The particular embodiment of the reactor 400 shown herein is provided for illustrative purposes and should not be used to limit the scope of the invention.

The reactor 400 generally comprises a process chamber 410 having a substrate pedestal 416 within a conductive body (wall) 430, and a controller 440.

In one embodiment, the chamber 410 is supplied with a substantially flat dielectric ceiling 420. Other modifications of the chamber 410 may have other types of ceilings, e.g., a dome-shaped ceiling. Above the ceiling 420 is disposed an antenna 412 comprising one ore more inductive coil elements (co-axial outer coil element 412a and inner coil element 412b are shown) that may be selectively controlled. The antenna 412 is coupled, through a first matching network 419, to a plasma power source 418. The plasma power source 418 typically is capable of producing up to 3000 W at a tunable frequency in a range from 50 kHz to 13.56 MHz. For etch reactions, the frequency is set to about 13.56 MHz.

In one embodiment, the substrate pedestal (cathode) 416 is coupled, through a second matching network 424, to a biasing power source 422. The biasing source 422 generally is a source of up to 500 W at a frequency of approximately 13.56 MHz that is capable of producing either continuous or pulsed power. In other embodiments, the source 422 may be a DC or pulsed DC source.

A controller 440 comprises a central processing unit (CPU) 444, a memory 442, and support circuits 446 for the CPU 444 and facilitates control of the components of the process chamber 410 and, as such, of the etch process, as discussed below in further detail.

An etchant gas and a passivation gas are provided to the process chamber 410 from a gas panel 438. In one embodiment, the etchant gas is provided through an inlet 426 located above the substrate pedestal 416, while the passivation gas is provided through a plurality of inlets 428 (e.g., openings, injectors, and the like). Alternatively, the passivation gas may be provided via an edge ring disposed proximate to an edge of a semiconductor substrate 414 being etched. In one embodiment, the inlets 428 (two inlets are shown) are positioned substantially equidistantly around the substrate pedestal 416 approximately coplanar with the semiconductor substrate 414. Embodiment and location of the inlets 428 are selected to provide high controlled concentration of the passivation gas in a peripheral region (i.e., annular region near the edge) of the wafer 414.

In one embodiment, the etchant gas and the passivation gas are delivered to the process chamber 410 using separate gas conduits (conduits 437 and 439, respectively) and the gases do not mix until are dispersed into a reaction volume 453 of the chamber. In the depicted embodiment, the etchant gas is illustratively provided to the inlets 426 using an annular gas channel 427 and, similarly, the passivation gas is provided to the inlets 428 using an annular gas channel 429. The gas channels 427 and 429 may be formed in the wall 430 or in gas rings (as shown) that are coupled to the wall 430. In the process chamber 410, the etchant and passivation gases form a gaseous mixture 450. During an etch process, the gaseous mixture 450 may be energized to a plasma 455 by applying power from the plasma source 418 to the antenna 412.

In one embodiment, the gas pressure in the chamber 410 is controlled using a throttle valve 477 and a vacuum pump 436. The temperature of the wall 430 may be controlled using liquid-containing conduits (not shown) that run through the wall 430. Typically, the chamber wall 430 is formed from a metal (e.g., aluminum (Al), stainless steel, and the like) and coupled to an electrical ground 434.

In operation, the temperature of the substrate 414 is controlled by stabilizing a temperature of the substrate pedestal 416. In one embodiment, a backside gas (e.g., helium (He)) from a gas source 448 is provided via a gas conduit 449 to channels that are formed in the pedestal surface under the substrate 414. The backside gas is used to facilitate heat transfer between the pedestal 416 and the substrate 414. During the processing, the pedestal 416 may be heated by an embedded resistive heater 432 to a steady-state temperature and then the helium gas facilitates uniform heating of the substrate 414. Using such thermal control, the substrate 414 may be maintained at a temperature between about 0 and 350 degrees Celsius.

In one embodiment, the substrate pedestal 416 comprises an electrostatic chuck 460, an edge ring 415, the resistive heater 432, a heat sink 466, and a mounting assembly 406. The electrostatic chuck 460 comprises at least one clamping electrode 480 and is controlled by a chuck power supply 476. The resistive heater 432 generally comprises at least one heating element 482 and is regulated by a heater power supply 478. In alternative embodiments, the substrate pedestal 416 may comprise a susceptor clamp ring, a mechanical chuck, and the like substrate retention mechanism.

In operation, the lift mechanism 462 is used to raise the substrate 414 off the substrate support 416 or to lower the substrate onto the substrate support. Generally, the lift mechanism 462 comprises a plurality of lift pins 472 (one lift pin is shown) that travel through respective guide holes 488. The process chamber 410 also comprises conventional systems for process control, internal diagnostic, end point detection, and the like. Such systems are collectively shown as support systems 407.

Those skilled in the art will understand that other forms of etch chambers may be used to practice the invention, including chambers with remote plasma sources, electron cyclotron resonance (ECR) plasma chambers, and the like.

To facilitate control of the process chamber 410, the controller 440 may be one of any form of general-purpose computer processor that can be used in an industrial setting for controlling various chambers and sub-processors. The memory, or computer-readable medium, 442 of the CPU 444 may be one or more of readily available memory such as random access memory (RAM), read only memory (ROM), floppy disk, hard disk, or any other form of digital storage, local or remote. The support circuits 446 are coupled to the CPU 444 for supporting the processor in a conventional manner. These circuits include cache, power supplies, clock circuits, input/output circuitry and subsystems, and the like. The inventive method is generally stored in the memory 442 as a software routine. Alternatively, such software routine may also be stored and/or executed by a second CPU (not shown) that is remotely located from the hardware being controlled by the CPU 444.

The invention may be practiced using other etch processes wherein parameters may be adjusted to achieve acceptable characteristics by those skilled in the art by utilizing the teachings disclosed herein without departing from the spirit of the invention. Although the forgoing discussion referred to fabrication of a field effect transistor, fabrication of the other devices and structures used in the integrated circuits can also benefit from the invention While the foregoing is directed to the illustrative embodiment of the present invention, other and further embodiments of the invention may be devised without departing from the basic scope thereof, and the scope thereof is determined by the claims that follow.

What is claimed is:

1. A method for etching a substrate, comprising:
providing a substrate to an etch processing chamber;
delivering an etchant gas into the processing chamber;
delivering a flow of passivation gas predominantly to a peripheral region of the substrate, wherein a rate of passivation gas flow to the peripheral region produces a first lateral etch uniformity result;
energizing the etchant and passivation gas within the chamber to form a plasma, wherein a center to edge plasma density is controllable and produces a second lateral etch uniformity result; and
setting the flow of passivation gas and the center to edge plasma density based on the combined first and second etch results to obtain a predetermined center to edge etch profile.

2. The method of claim 1, wherein the flow of passivation gas and the center to edge plasma density are set to produce a uniform center to edge etch profile.

3. The method of claim 1, wherein the passivation gas is at least one gas selected from the group consisting of $SiF_4$ and $SiH_4$, and the etchant gas comprises at least one of HBr, $Cl_2$, and $O_2$.

4. The method of claim 1, wherein the step of delivering the flow of passivation gas further comprises:
injecting the passivation gas from a nozzle coupled to a chamber sidewall.

* * * * *